（12）United States Patent
Pang et al.

(10) Patent No.: US 10,992,897 B2
(45) Date of Patent: *Apr. 27, 2021

(54) OPERATING METHOD OF PIXEL CIRCUIT AND IMAGE SYSTEM (71) Applicant: PixArt Imaging Inc., Hsin-Chu (TW)

(72) Inventors: Kwai-Lee Pang, Penang (MY); Swee-Lin Thor, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/658,303

(22) Filed: Oct. 21, 2019

(65) Prior Publication Data
US 2020/0053305 A1    Feb. 13, 2020

Related U.S. Application Data (63) Continuation of application No. 16/036,107, filed on Jul. 16, 2018, now Pat. No. 10,491,849, which is a continuation of application No. 14/940,369, filed on Nov. 13, 2015, now Pat. No. 10,057,526.

(51) Int. Cl.
H04N 5/378    (2011.01)
H04N 5/235    (2006.01)
H04N 5/355    (2011.01)
G06F 3/01     (2006.01)
H01L 27/146   (2006.01)

(52) U.S. Cl.
CPC .............. H04N 5/378 (2013.01); G06F 3/01 (2013.01); H04N 5/2353 (2013.01); H04N 5/35536 (2013.01); H01L 27/14681 (2013.01)

(58) Field of Classification Search
CPC .. H04N 5/378; H04N 5/2353; H04N 5/35536; G06F 3/01; H01L 27/14681
See application file for complete search history.

(56) References Cited

U.S. PATENT DOCUMENTS 9,385,158 B2 * 7/2016 Lim .................. H01L 27/14681
2011/0090385 A1 * 4/2011 Aoyama ............ H04N 5/37452
348/308

* cited by examiner

Primary Examiner — Ahmed A Berhan
(74) Attorney, Agent, or Firm — WPAT, PC (57) ABSTRACT A pixel circuit including a photodiode, a first storage capacitor and a second storage capacitor is provided. The first storage capacitor discharges to a first output voltage in a first exposure time and to a third output voltage in a third exposure time. The second storage capacitor discharges to a second output voltage in a second exposure time and to a fourth output voltage in a fourth exposure time. The first and second exposure times are included in a first frame period. The third and fourth exposure times are included in a second frame period. The second frame period is a next frame period of the first frame period. In the first frame period, the first exposure time is subsequent to the second exposure time. In the second frame period, the third exposure time is prior to the fourth exposure time.

20 Claims, 10 Drawing Sheets

OPERATING METHOD OF PIXEL CIRCUIT AND IMAGE SYSTEM

CROSS REFERENCE TO RELATED APPLICATION

This application is a continuation application of U.S. application Ser. No. 16/036,107, filed on Jul. 16, 2018, which is a continuation application of U.S. application Ser. No. 14/940,369, filed on Nov. 13, 2015, the full disclosure of which is incorporated herein by reference.

BACKGROUND

1. Field of the Disclosure

This disclosure generally relates to an image system and, more particularly, to a pixel circuit with low power consumption, an image system including the same and an operating method thereof.

2. Description of the Related Art

Figure 1:
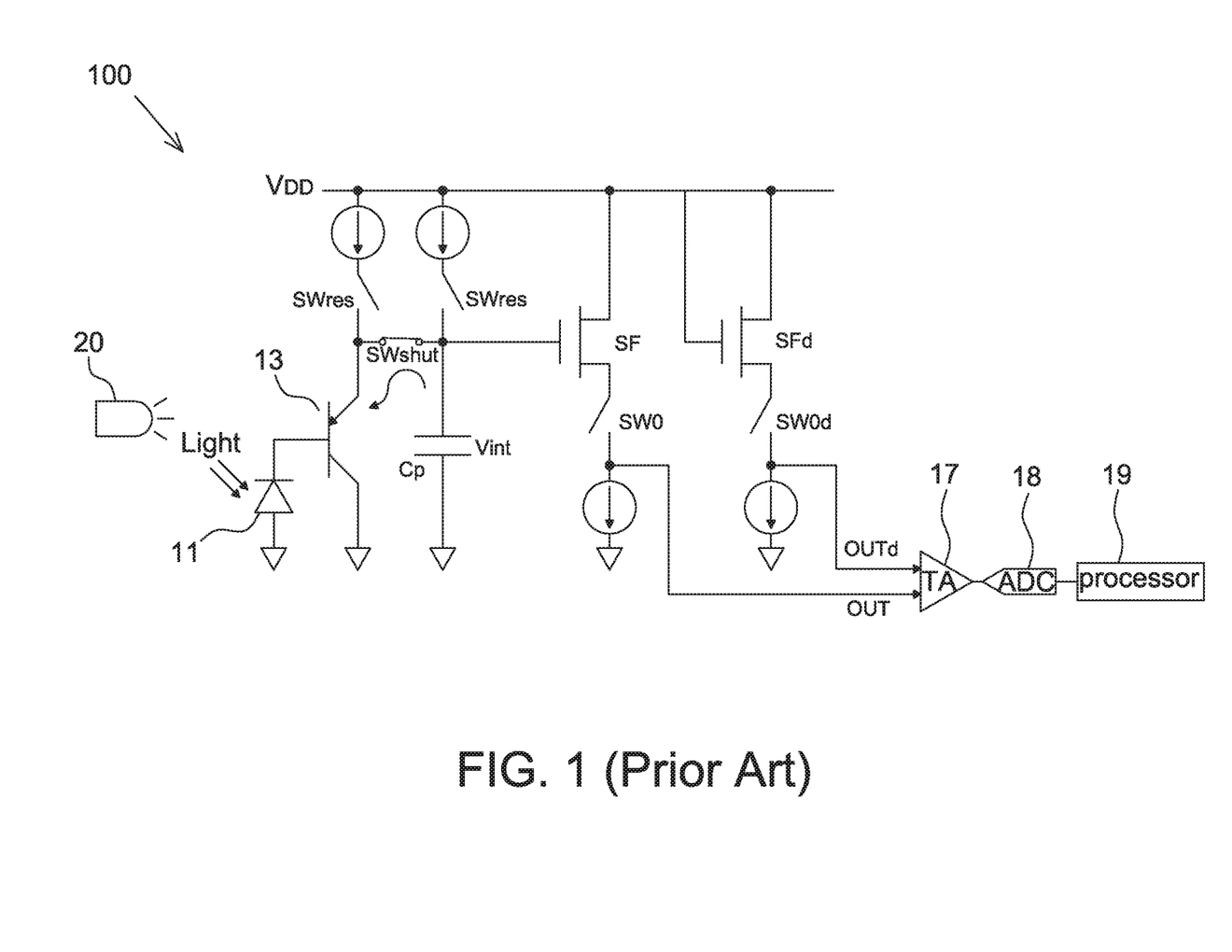
FIG. 1 is a schematic diagram of a conventional BJT pixel circuit.

Referring to FIG. 1, it is a schematic diagram of a conventional bipolar junction transistor (BJT) pixel circuit 100. The BJT pixel circuit 100 includes a photodiode 11, a BJT transistor 13, a pixel capacitor Cp, a power source $V_{DD}$, a plurality of switching elements SWres, SWshut, SW0, SW0d and two source followers SF and SFd.

Figure 2:
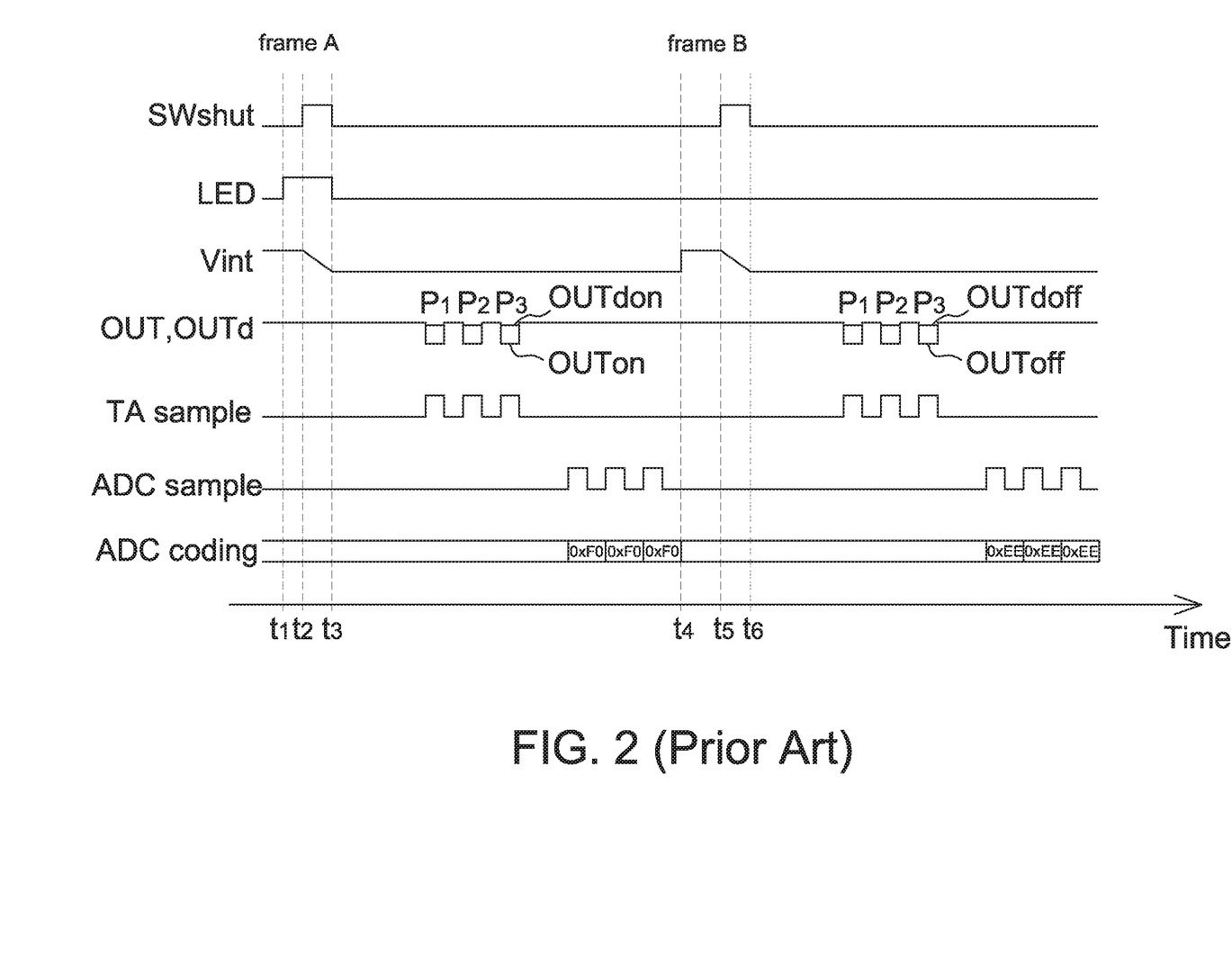
FIG. 2 is an operational timing diagram of an image sensor including the BJT pixel circuit of FIG. 1.

FIG. 2 is an operational timing diagram of an image sensor including the BJT pixel 100 of FIG. 1, and herein the sensor array having three pixel circuits P1, P2 and P3 is taken as an example for illustration purpose.

The BJT pixel circuit 100 may operate in two phases, including a reset phase and a shutter phase, by controlling the switching elements, wherein in the reset phase the switching elements SWres are conducted, while in the shutter phase the switching element SWshut is conducted. The reset phase is used to release charges left in the photodiode 11 and to charge the pixel capacitor Cp to an initial voltage Vint. The shutter phase is to allow the BJT pixel circuit 100 to discharge the initial voltage Vint and the discharging rate is a function of light intensity. FIG. 1 shows a state of the shutter phase which operates corresponding to a system light source 20. The system light source 20 is activated corresponding to a first frame A and deactivated corresponding to a second frame B (referring to FIG. 2), wherein the second frame B is sometimes referred to an ambient image frame.

In the first frame A, a period between the system light source 20 being activated (e.g. time $t_1$) and the switching element SWshut being conducted (e.g. time $t_2$) is referred to a pre-flash time, which is arranged to allow the BJT transistor 13 to achieve a stable output. After the switching element SWshut is conducted, charges held in the pixel capacitor Cp discharges via the BJT transistor 13 in an exposure time (e.g. time t2 to t3) to lower the initial voltage Vint, wherein a decrement of the initial voltage Vint corresponds to the light intensity received by the photodiode 11.

However, in the pre-flash time, the system light source 20 is turned on previously and thus the total power consumption of the system is increased.

SUMMARY

Accordingly, the present disclosure further provides a pixel circuit with low power consumption, an image system including the same and an operating method thereof.

The present disclosure provides an operating method of an image system. The image system includes a light source and a sensor array. The operating method includes the steps of: turning on the light source from a light-on time within a first frame period to a light-off time within a second frame period, wherein the second frame period is a frame period subsequent to the first frame period; performing a first dark exposure of the sensor array within the first frame period and before the light-on time; performing a first bright exposure of the sensor array within the first frame period and before the second frame period; reading, prior to the second frame period, the sensory array according to a read signal; performing a second bright exposure of the sensor array within the second frame period and before the light-off time; and performing a second dark exposure of the sensor array within the second frame period and after the light-off time, wherein the light source is maintained turning on from the light-on time to the light-off time.

The present disclosure further provides an operating method of an image system. The image system includes a light source and a sensor array. The operating method includes the steps of: keeping the light source being continuously turned on from a first frame period to a second frame period, wherein the second frame period is a frame period subsequent to the first frame period; within the first frame period, performing a bright exposure of the sensor array subsequent to a dark exposure of the sensor array; reading, prior to the second frame period, the sensory array according to a read signal; and within the second frame period, performing a bright exposure of the sensor array prior to a dark exposure of the sensor array, wherein in the bright exposure the light source is being turned on, and in the dark exposure the light source is being turned off.

In one aspect, the image system of the present disclosure is applicable to a proximity sensor and a gesture recognition system under strong ambient light.

In another aspect, the image system of the present disclosure is able to reduce the power consumption under low ambient light without changing the circuit structure.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 3:
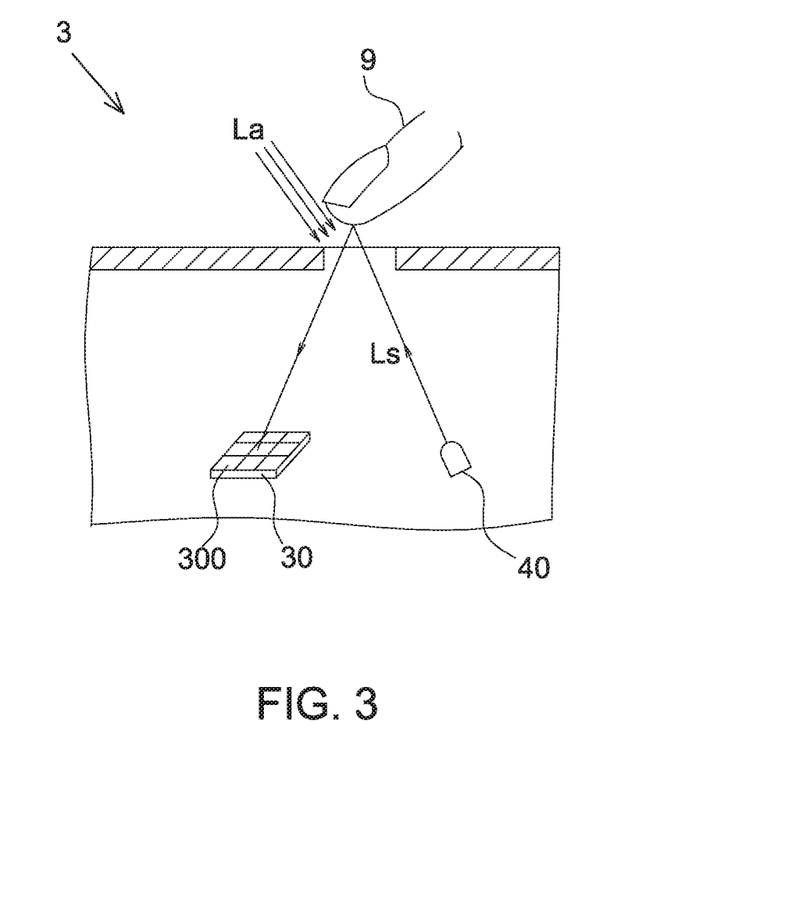
FIG. 3 is an operational schematic diagram of an image system according to one embodiment of the present disclosure.

Referring to FIG. 3, it is an operational schematic diagram of an image system 3 according to one embodiment of the present disclosure. The image system 3 includes an image sensor 30 and a system light source 40. The image system 3 is applicable to a proximity system or a gesture recognition system, and used to detect a proximity operation and/or a gesture of an object 9 (e.g. a finger). The image sensor 30 is preferably an active image sensor such as a CMOS image sensor. During operation, the image sensor 30 detects system light Ls, which is emitted from the system light source 40 and reflected by the object 9, and external ambient light La. When the ambient light La (e.g. sun light) is too strong, the intensity of the system light Ls sensed by the image sensor 30 is very tiny compared to the sensed ambient light La such that the function of the system light source 40 is not apparent and failure can be caused.

Figure 4:
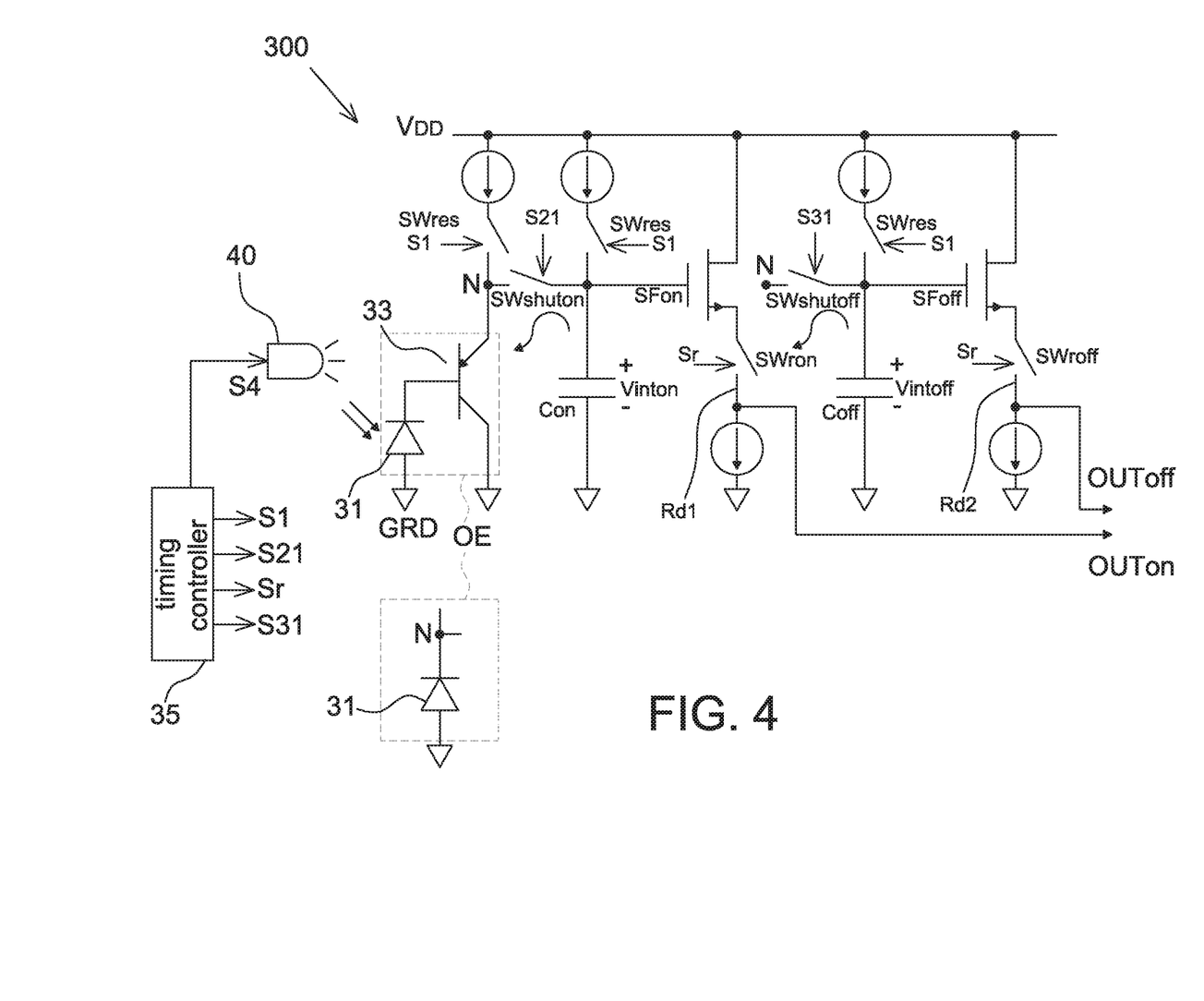
FIG. 4 is a schematic diagram of a BJT pixel circuit according to one embodiment of the present disclosure.
Figure 5:
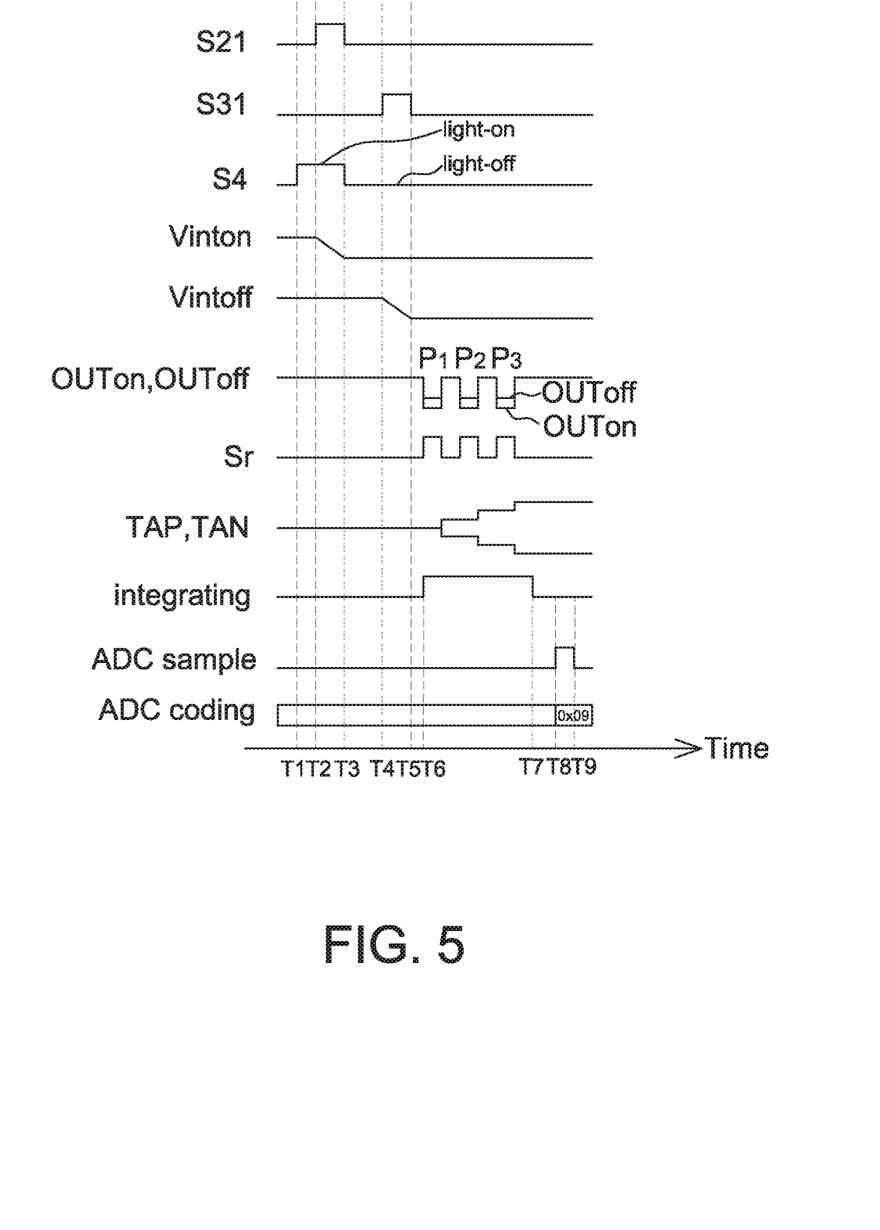
FIG. 5 is an operational timing diagram of an image sensor including the BJT pixel circuit of FIG. 4.

Referring to FIGS. 3 to 5, FIG. 4 is a schematic diagram of a bipolar junction transistor (BJT) pixel circuit 300 according to one embodiment of the present disclosure, and FIG. 5 is an operational timing diagram of an image sensor including the BJT pixel circuit 300 of FIG. 4. The image sensor 30 includes a plurality of BJT pixel circuits 300 arranged in a matrix (e.g. 9 BJT pixel circuits 300 are shown in FIG. 3). The plurality of BJT pixel circuits 300 is configured to generate output voltages OUTon and OUToff corresponding to a light source signal S4, wherein the light source signal S4 has a light-on level and a light-off level (e.g. shown in FIG. 5). The image sensor 30 further includes a timing controller 35 for providing the light source signal S4 to the system light source 40 and providing other control signals S1, S21, Sr, S31 (illustrated with examples hereinafter) to the BJT pixel circuits 300. In some embodiments, the timing controller 35 is included, for example, in a processor 39 (e.g. referring to FIGS. 6 and 7), wherein the processor is, for example, a digital signal processor (DSP), a central processing unit (CPU), a microcontroller (MCU) or the like, but not limited thereto.

The BJT pixel circuit 300 includes a photodiode 31, a BJT transistor 33, a first storage capacitor Con, a second storage capacitor Coff, a first shutter switch SWshuton, a second shutter switch SWshutoff, a first read switch SWron, a second read switch SWroff, a first source follower SFon, a second source follower SFoff and three reset switches SWres, wherein the first storage capacitor Con and the first shutter switch SWshuton operate corresponding to the activation (i.e. the light-on level) of the system light source 40, and the second storage capacitor Coff and the second shutter switch SWshutoff operate corresponding to the deactivation (i.e. the light-off level) of the system light source 40.

In one embodiment, the photodiode 31 is integrated in the BJT transistor 33. The BJT transistor 33 is a PNP bipolar junction transistor and the photodiode 31 is integrated in the PN junction between the base and collector of the BJT transistor 33. The emitter of the BJT transistor 33 is coupled to a node N.

In another embodiment, the BJT transistor 33 might not be necessary whereby the photodiode 31 is sufficient. The photodiode 31 has a cathode and an anode. The cathode is coupled to the node N.

That is, in the present disclosure, the emitter of the BJT transistor 33 or the cathode of the photodiode 31 is coupled to the node N.

The photodiode 31 senses both the system light Ls and ambient light La corresponding to the activation of the system light source 40 to generate photocurrent, while the photodiode 31 senses only the ambient light La corresponding to the deactivation of the system light source 40 to generate photocurrent, wherein said photocurrent is positively correlated with the sensed light intensity.

The first storage capacitor Con has a first terminal coupled to the emitter of the BJT transistor 33 (or the cathode of the photodiode 31) via the first shutter switch Swshuton and a second terminal coupled to the ground GRD. A reset switch SWres is coupled between the first terminal of the first storage capacitor Con and a power source $V_{DD}$. The first shutter switch Swshuton is configured to control, according to a first shutter signal S21, a first exposure time (e.g. T2 to T3 shown in FIG. 5) of the photodiode 31 to correspond to the light-on level of the light source signal S4. The first storage capacitor Con is to hold a first predetermined voltage Vinton (e.g. charged by the power source $V_{DD}$ through the reset switch SWres in a reset phase) before the first exposure time and to discharge, via the photodiode 31, to a first output voltage OUTon in the first exposure time, wherein a voltage value of the first output voltage OUTon is determined according to the light exposure of the photodiode 31 within the first exposure time.

The second storage capacitor Coff has a first terminal coupled to the emitter of the BJT transistor 33 (or the cathode of the photodiode 31) via the second shutter switch Swshutoff and a second terminal coupled to the ground GRD. A reset switch SWres is coupled between the first terminal of the second storage capacitor Coff and the power source $V_{DD}$. The second shutter switch Swshutoff is configured to control, according to a second shutter signal S31, a second exposure time (e.g. T4 to T5 shown in FIG. 5) of the photodiode 31 to correspond to the light-off level of the light source signal S4. The second storage capacitor Coff is to hold a second predetermined voltage Vintoff (e.g. charged by the power source $V_{DD}$ through the reset switch SWres in a reset phase) before the second exposure time and to discharge, via the photodiode 31, to a second output voltage OUToff in the second exposure time, wherein a voltage value of the second output voltage OUToff is determined according to the light exposure of the photodiode 31 within the second exposure time.

The first read switch SWron is coupled between the first terminal of the first storage capacitor Con (i.e. the node N) and a readout line Rd1, and to couple the first storage capacitor Con to the readout line Rd1 according to a read signal Sr so as to output the first output voltage OUTon, wherein the read signal Sr is, for example, a row scan signal. The readout line Rd1 is coupled to a column of BJT pixel circuits 300 and a current source, and to transmit the output voltages from each of the coupled BJT pixel circuits 300.

The first source follower SFon has a gate, a source and a drain, and is to buffer the first output voltage OUTon on the first storage capacitor Con nondestructively to the readout line Rd1. The gate of the first source follower SFon is coupled to the first terminal of the first storage capacitor Con (i.e. the node N). The source of the first source follower SFon is coupled to the readout line Rd1 via the first read switch SWron. The drain of the first source follower SFon is coupled to the power source $V_{DD}$.

The second read switch SWroff is coupled between the first terminal of the second storage capacitor Coff (i.e. the node N) and a readout line Rd2, and to couple the second storage capacitor Coff to the readout line Rd2 according to a read signal Sr so as to output the second output voltage OUToff, wherein the read signal Sr is, for example, a row scan signal. The readout line Rd2 is coupled to a column of BJT pixel circuits 300 and a current source, and to transmit the output voltages from each of the coupled BJT pixel circuits 300.

The second source follower SFoff has a gate, a source and a drain, and is to buffer the second output voltage OUToff on the second storage capacitor Coff nondestructively to the readout line Rd2. The gate of the second source follower SFoff is coupled to the first terminal of the second storage capacitor Coff (i.e. the node N). The source of the second source follower SFoff is coupled to the readout line Rd2 via the second read switch SWroff. The drain of the second source follower SFon is coupled to the power source $V_{DD}$.

It should be mentioned that although FIG. 4 shows that the readout line Rd1 coupled to the first read switch SWron and the readout line Rd2 coupled to the second read switch SWroff are two different readout lines, the present disclosure is not limited thereto. In some embodiments, the first read switch SWron and the second read switch SWroff may be coupled to a same readout line to output voltage signals read from the first storage capacitor Con and the second storage capacitor Coff.

Two reset switches SWres are respectively coupled between the power source $V_{DD}$ and the first storage capacitor Con and the second storage capacitor Coff, and to couple the first storage capacitor Con and the second storage transistor Coff to the power source $V_{DD}$ according to a reset signal S1 to respectively charge the first storage capacitor Con and the second storage capacitor Coff to the first predetermined voltage Vinton and the second predetermined voltage Vintoff, wherein values of the first predetermined voltage Vinton and the second predetermined voltage Vintoff are determined according to different applications without particular limitations. Another reset switch SWres is coupled between the power source VDD and the node N (i.e. emitter of the BJT transistor 33 or the cathode of the photodiode 31) and configured to couple the emitter of the BJT transistor 33 or the cathode of the photodiode 31 to the power source $V_{DD}$ according to a reset signal S1 thereby releasing charges left in the photodiode 31 in a reset phase. Accordingly, within the first exposure time, the first storage capacitor Con discharges from the first predetermined voltage Vinton to the first output voltage OUTon through photocurrent; and within the second exposure time, the second storage capacitor Coff discharges from the second predetermined voltage Vintoff to the second output voltage OUToff through photocurrent.

In this embodiment, the first shutter switch SWshuton, the second shutter switch SWshutoff, the first read switch SWron, the second read switch SWroff and the reset switches SWres are, for example, N-type MOS transistors, but not limited thereto, and they may be other analog switches.

In addition, as shown in FIG. 5, before the first exposure time, the system light source 40 further emits light within a pre-flash time (e.g. T1 to T2) so as to allow the BJT transistor 33 to reach a stable output.

Figure 6:
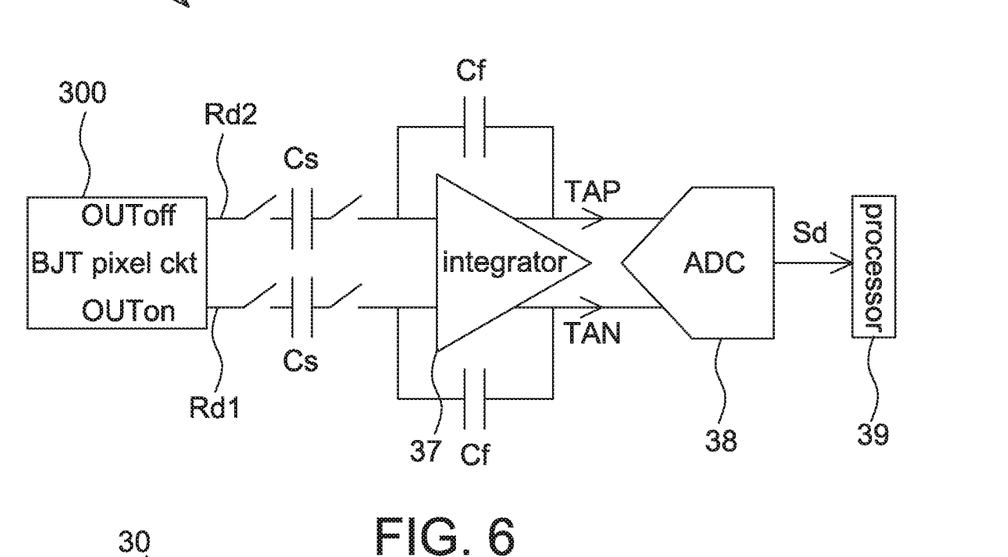
FIG. 6 is a schematic block diagram of an image sensor including the BJT pixel circuit of FIG. 4.

Referring to FIG. 6, it is a schematic block diagram of an image sensor 30 including the BJT pixel circuit 300 in FIG. 4. The image sensor 30 further includes an integrator 37 and an analog to digital converter (ADC) 38, wherein the integrator 37 is, for example, a differential integrator having two input terminals, and the ADC converter 38 is, for example, a differential ADC converter having two input terminals. Two input terminals of the integrator 37 are coupled to the BJT pixel circuits 300 through the readout lines (e.g. Rd1 and Rd2) so as to receive the first output voltage OUTon and the second output voltage OUToff, respectively. The image sensor 30 includes two capacitors Cs for sampling the first output voltage OUTon and the second output voltage OUToff, respectively. The image sensor 30 includes two capacitors Cf coupled between inputs and outputs of the integrator 37 for holding voltage data in the integrating/accumulating process performed by the integrator 37.

Referring to FIGS. 4-6, when the first read switch SWron and the second read switch SWroff are switched on, the integrator 37 reads first output voltages OUTon and second output voltages OUToff from, for example, three pixel circuits P1 to P3, wherein for illustration purpose the pixel circuits P1 to P3 are assumed to generate identical output voltages herein. As mentioned above, as the first output voltage OUTon reflects the system light Ls and the ambient light La together (referring to FIG. 3), while the second output voltage OUToff reflects only the ambient light La, a voltage value of the first output voltage OUTon is considered to be lower than that of the second output voltage OUToff. The integrator 37 is to perform the differential operation on the first output voltage OUTon and the second output voltage OUToff outputted from each of the BJT pixel circuits 300 so as to generate differential signals TAP and TAN, e.g., TAP−TAN=(OUToff−OUTon). In some embodiments, the integrator 37 further amplifies the differential signals TAP and TAN with a gain, e.g., TAP−TAN=G×(OUToff−OUTon). The ADC converter 38 is to convert the differential signals (OUToff−OUTon) or amplified differential signals G×(OUToff−OUTon) to a digital signal Sd, wherein the digital signal Sd includes the effect of system light Ls but does not include the effect of ambient light La.

In some embodiments, under strong ambient La, where the system light Ls is very small compared to the ambient light La, the integrator 37 integrates/accumulates more differential signals TAP and TAN to generate integrated/accumulated differential signals. For example in FIG. 5, the integrator 37 respectively amplifies and integrates/accumulates the differential signals TAP and TAN corresponding to the pixel circuits P1 to P3 in a time interval T6 to T7. More specifically, the integrator 37 amplifies and integrates/accumulates the differential signals TAP and TAN corresponding to all BJT pixel circuits 300 of a sensor array of the image sensor 30 so as to output integrated/accumulated and amplified differential signals corresponding to every frame, e.g., TAP−TAN=NP×G×(OUToff−OUTon), wherein the term "NP" indicates a number of BJT pixel circuits 300 being integrated/accumulated and the term "G" indicates a gain, and it is also assumed that every BJT pixel circuit 300 has substantially identical outputs. As mentioned above, under strong ambient light La, the system light Ls is very small compared to the ambient light La, by employing the integrator 37, the signal to noise ratio (SNR) is significantly improved and the accuracy of the proximity detection is improved. In some embodiments, when the image sensor 30 is not under strong ambient light La, the integrator 37 amplifies and accumulates the differential signals TAP and TAN corresponding to lesser number of BJT pixel circuits 300. More specifically, in the present disclosure, an accumulated number of the differential signals of the BJT pixel circuits 300 is adjustable (i.e. NP is adjustable). Finally, the ADC converter 38 samples the amplified and accumulated differential signals NP×G×(TAP−TAN) to generate a digital signal Sd, e.g. shown as coding 0x09 in FIG. 5, but not limited thereto. Therefore, as the ADC converter 38 samples the accumulated differential signals instead of samples the signal output by each of the BJT pixel circuits 300, the sampling of the ADC converter 38 is reduced.

Figure 7:
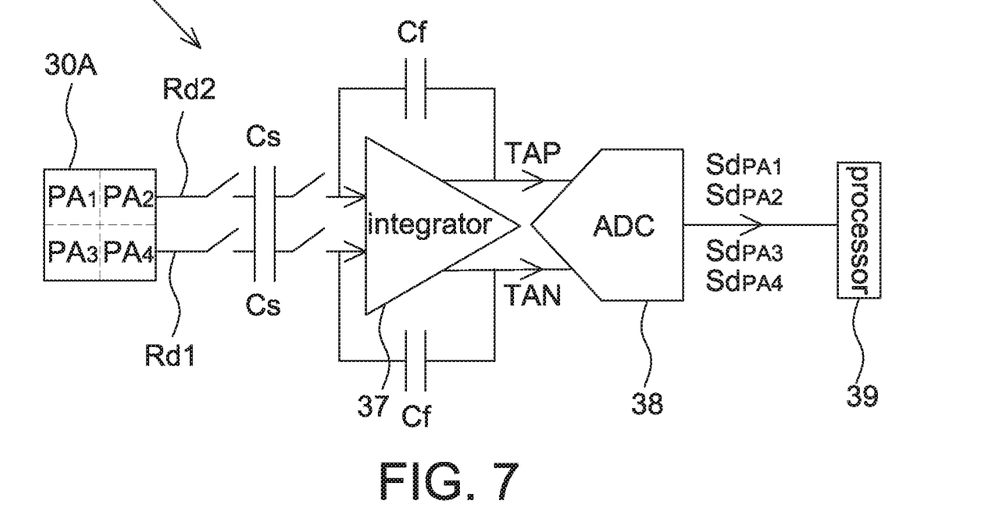
FIG. 7 is another schematic block diagram of an image sensor including the BJT pixel circuit of FIG. 4.

In some embodiments, the integrator 37 accumulates the differential signals TAP and TAN corresponding to a part of BJT pixel circuits 300 of a sensor array of the image sensor 30 instead of corresponding to all BJT pixel circuits 300. Referring to FIG. 7, the image sensor 30 includes a sensor array 30A which is divided into a first pixel area PA1, a second pixel area PA2, a third pixel area PA3 and a fourth pixel area PA4, wherein each of the pixel areas PA1 to PA4 includes a plurality of BJT pixel circuits 300 shown in FIG. 4. The integrator 37 amplifies and accumulates the differential signals TAP and TAN corresponding to the BJT pixel circuits 300 in the first pixel area PA1 to generate amplified and accumulated differential signals NP×G×(TAP−TAN), and the ADC converter 38 digitizes the amplified and accumulated differential signals NP×G×(TAP−TAN) to generate a digital signal $Sd_{P41}$. Similarly, the ADC converter 38 generates digital signals $Sd_{P42}$, $Sd_{P43}$ and $Sd_{P44}$ corresponding to the second pixel area PA2, the third pixel area PA3 and the fourth pixel area PA4, respectively. A processor 39 respectively identifies a proximity operation of an object corresponding to every pixel area PA1 to PA4 according to the digital signals $Sd_{P41}$ to $Sd_{P44}$ so as to implement the function of gesture recognition, e.g. identifying a moving direction of the gesture/object, based on the variation of the digital signals $Sd_{P41}$ to $Sd_{P44}$ of every pixel area PA1 to PA4. It should be mentioned that although FIG. 7 shows that the pixel areas PA1 to PA4 are coupled to a same integrator 37 and ADC converter 38, it is only intended to illustrate but not to limit the present disclosure. In other embodiments, the pixel areas PA1 to PA4 are respectively coupled to an individual integrator 37 and ADC converter 38, e.g. numbers of the integrators 37 and ADC converters 38 are equal to a number of the pixel areas.

Figure 8:
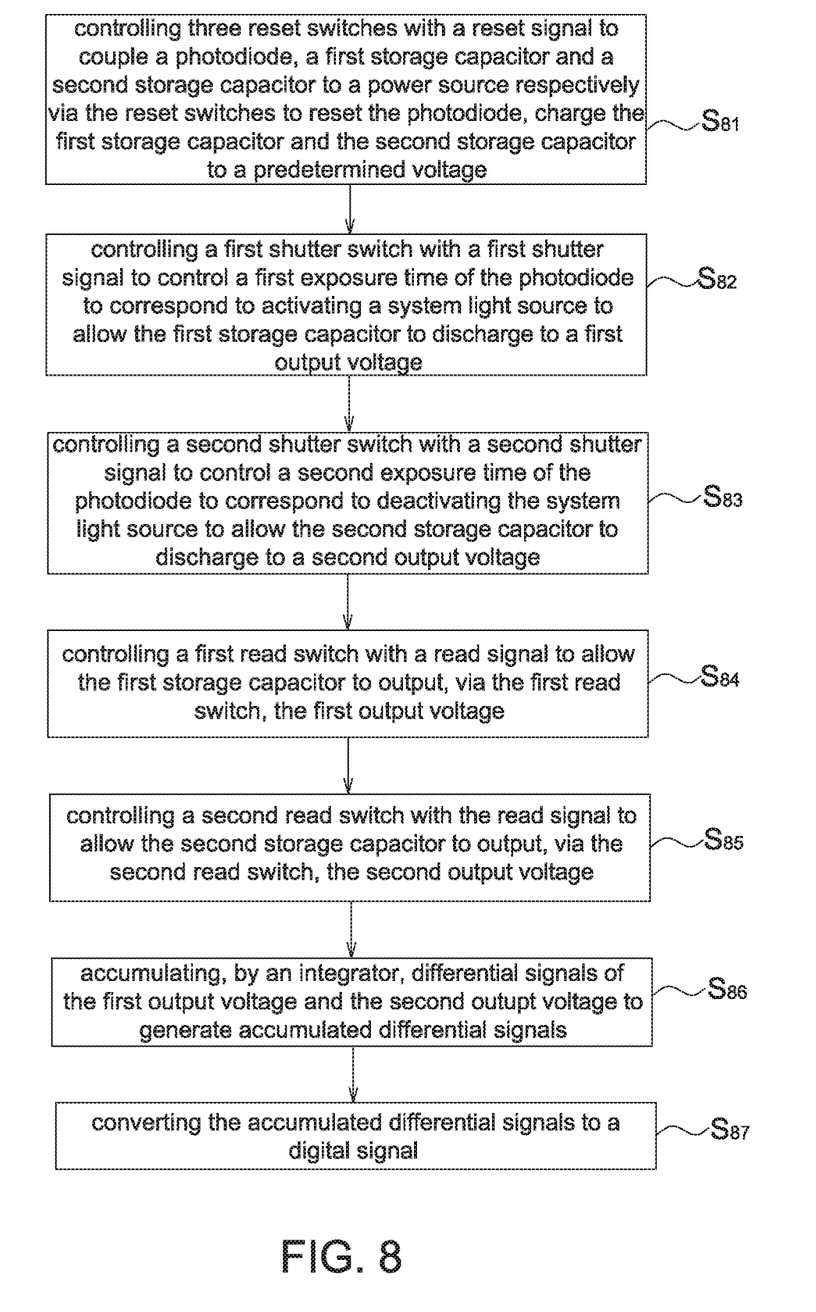
FIG. 8 is a flow chart of an operating method of an image system according to one embodiment of the present disclosure.

Referring to FIG. 8, it is a flow chart of an operating method of an image system 3 according to one embodiment of the present disclosure, which includes the steps of: controlling three reset switches with a reset signal to couple a photodiode, a first storage capacitor and a second storage capacitor to a power source respectively via the reset switches to reset the photodiode and charge the first storage capacitor and the second storage capacitor to a predetermined voltage (Step S81); controlling a first shutter switch with a first shutter signal so as to control a first exposure time of the photodiode to correspond to activating a system light source to allow the first storage capacitor to discharge to a first output voltage (Step S82); controlling a second shutter switch with a second shutter signal so as to control a second exposure time of the photodiode to correspond to deactivating the system light source to allow the second storage capacitor to discharge to a second output voltage (Step S83); controlling a first read switch with a read signal to allow the first storage capacitor to output, via the first read switch, the first output voltage (Step S84); controlling a second read switch with the read signal to allow the second storage capacitor to output, via the second read switch, the second output voltage (Step S85); accumulating, by an integrator, differential signals of the first output voltage and the second output voltage to generate accumulated differential signals (Step S86); and converting the accumulated differential signals to a digital signal (Step S87), wherein when the image system 3 operates under stronger ambient light, a number of the accumulated differential signals is higher; whereas when the image system 3 operates under weaker ambient light, a number of the accumulated differential signals is lower thereby improving the SNR.

Referring to FIGS. 4 to 6 and 8, details of the operating method are illustrated hereinafter.

Step S81: Firstly, a timing controller 35 (or a processor 39) sends a reset signal S1 in a reset phase to conduct three reset switches SWres. Accordingly, a first storage capacitor Con, a second storage capacitor Coff and a photodiode 31 (or an emitter of BJT transistor 33 if it is included) are respectively coupled to a power source $V_{DD}$ via the reset switches SWres. The power source $V_{DD}$ provides a current to respectively charge the first storage capacitor Con and the second storage capacitor Coff to a first predetermined voltage Vinton and a second predetermined voltage Vintoff, and reset the photodiode 31.

Step S82: The timing controller 35 sends a first shutter signal S21 for controlling a first shutter switch SWshuton so as to control a first exposure time (e.g. T2 to T3) of the photodiode 31 to correspond to activating a system light source 40 (e.g. activated by a light source signal S4) to allow the first storage capacitor Con to discharge, e.g., via the BJT transistor 33 or photodiode 31, to a first output voltage OUTon, wherein the first output voltage OUTon is determined according to the light absorption of the photodiode 31.

Step S83: The timing controller 35 sends a second shutter signal S31 to control a second shutter switch SWshutoff so as to control a second exposure time (e.g. T4 to T5) of the photodiode 31 to correspond to deactivating the system light source 40 to allow the second storage capacitor Coff to discharge, e.g., via the BJT transistor 33 or photodiode 31, to a second output voltage OUToff, wherein the second output voltage OUToff is determined according to the light absorption of the photodiode 31.

Step S84: The timing controller 35 then sends a read signal Sr to control a first read switch SWron to conduct to allow the first storage capacitor Con to output, via the first read switch SWron, the first output voltage OUTon to a readout line Rd1. As mentioned above, in order to buffer the first output voltage OUTon on the first storage capacitor Con nondestructively to the readout line Rd1, a first source follower SFon is coupled between the first read switch SWron and the first storage capacitor Con.

Step S85: Meanwhile, the timing controller 35 sends the read signal Sr to control a second read switch SWroff to conduct to allow the second storage capacitor Coff to output, via the second read switch SWroff, the second output voltage OUToff to a readout line Rd2. Similarly, in order to buffer the second output voltage OUToff on the second storage capacitor Coff nondestructively to the readout line Rd2, a second source follower SFoff is coupled between the second read switch SWroff and the second storage capacitor Coff.

It should be mentioned that although FIG. 5 shows that the read signal Sr conducts the first read switch SWron and the second read switch Swoff concurrently (e.g. the Steps S84 and S85 in FIG. 8 combined in one step) to concurrently readout the first output voltage OUTon and the second output voltage OUToff, but the present disclosure is not limited thereto. In some embodiments, the read signal Sr may non-concurrently conduct the first read switch SWron and the second read switch SWroff as long as an integrator 37 coupled behind the readout lines is able to perform the differential, amplification and integration/accumulation operations on the first output voltage OUTon and the second output voltage OUToff, e.g., including a delay circuit or storage components.

Step S86: Next, the integrator 37 receives the first output voltage OUTon and the second output voltage OUToff through the readout lines (e.g. Rd1 and Rd2) and performs differential operation on the first output voltage OUTon and the second output voltage OUToff to generate differential signals TAP and TAN. The integrator 37 also performs the amplification and integration/accumulation operations on the differential signals TAP and TAN of the first output voltage OUTon and the second output voltage OUToff to generate amplified and accumulated differential signals, e.g., NP×G×(TAP−TAN), wherein NP is adjustable in the present disclosure.

Step S87: Finally, a ADC converter 38 converts the amplified and accumulated differential signals to a digital signal Sd, wherein the digital signal Sd is sent to a processor 39 for post-processing, e.g. performing the proximity detection or gesture recognition.

It should be mentioned that FIG. 5 is only intended to show the sequential relationship but the signal interval and the interval between signals are not limited to those shown in FIG. 5.

It should be mentioned that although a differential ADC converter is taken as an example in the above embodiments, the present disclosure is not limited thereto. The differential ADC converter has a merit to reduce the noise so as to obtain better detection results. In other embodiments, an ADC converter with a single input may be used).

As mentioned above, before the exposure of the photodiode 31, the system light source 40 is turned on for a pre-flash time (e.g. T1 to T2 shown in FIG. 5) to allow the BJT transistor 300 to achieve a stable output. However, in the image system 3, the power consumption of the system light source 40 is much higher than that of the image sensor 30, and the pre-flash time is implemented by lighting the system light source 40. Accordingly, the pre-flash time increases the total power consumption of the image system 3.

Figure 9:
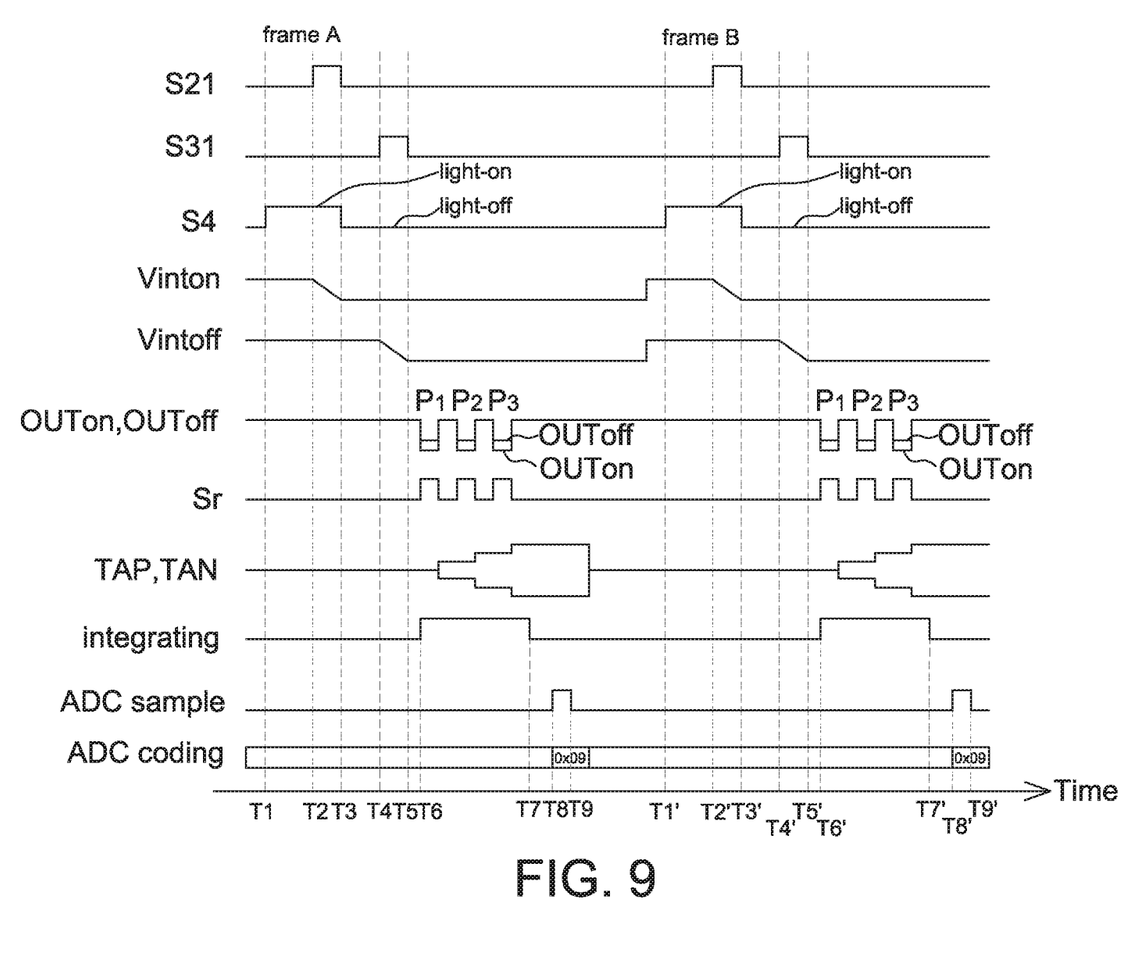
FIG. 9 is an operational timing diagram of an image sensor capturing two successive frames according to one embodiment of the present disclosure.

For example, referring to FIG. 9, it is an operational timing diagram of an image system 3 capturing two successive frames (e.g. frame A and frame B) according to one embodiment of the present disclosure, wherein the operation of each frame period is identical to that shown in FIG. 5. FIG. 9 is applicable, for example, the operation under normal or strong ambient light. It is clear from FIG. 9 that a first frame period A and a second frame period B include a pre-flash time, e.g., T1 to T2 and T1' to T2', respectively. More specifically speaking, each frame period includes a pre-flash time.

Therefore, in another embodiment of the present disclosure, by employing only one pre-flash time within two adjacent frame periods so as to reduce the total power consumption and improve the detection speed of the image system 3.

Figure 10:
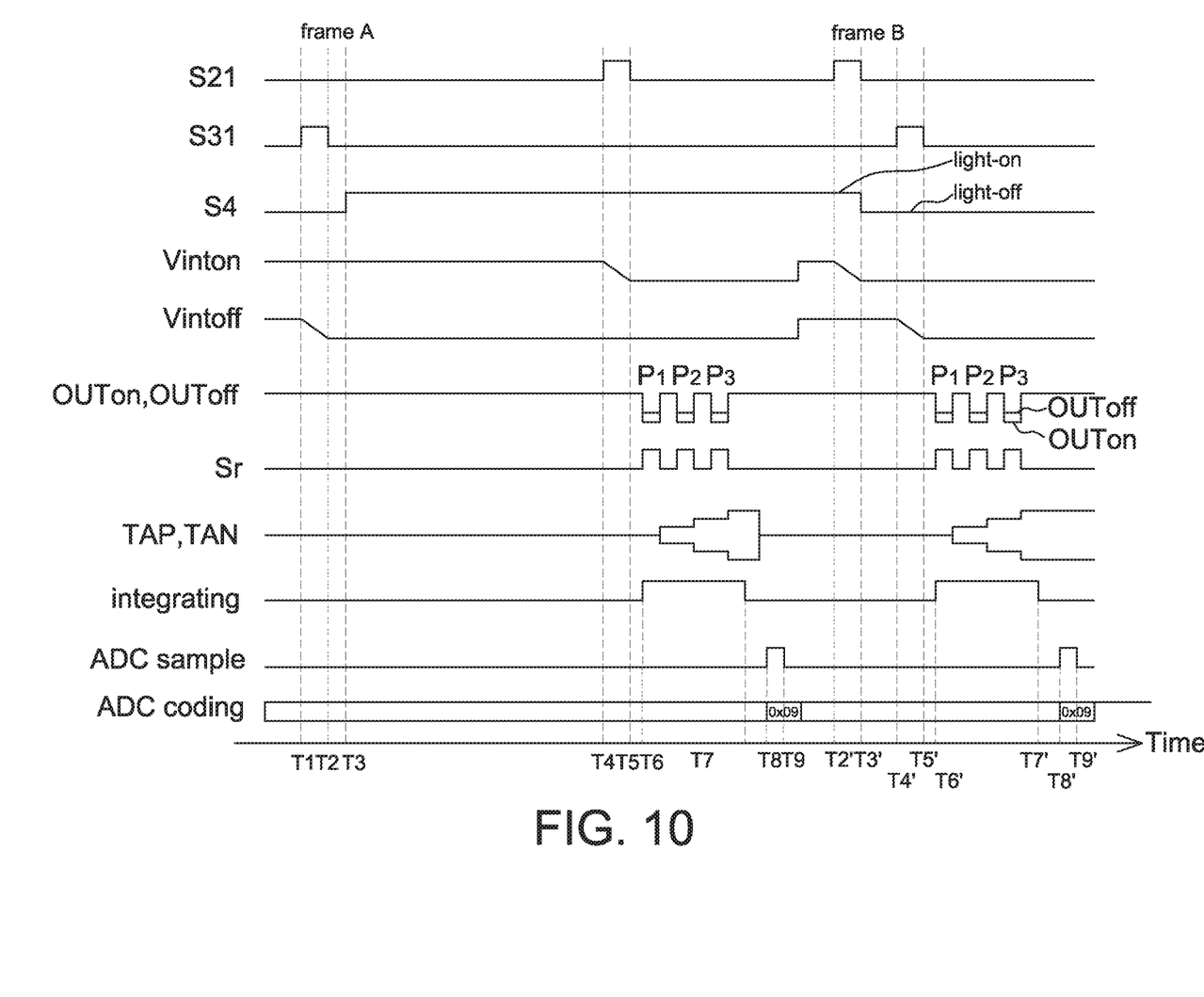
FIG. 10 is an operational timing diagram of an image sensor capturing two successive frames according to another embodiment of the present disclosure.

Referring to FIG. 10, it is an operational timing diagram of an image system 3 capturing two successive frames (e.g. frame A and frame B) according to another embodiment of the present disclosure, wherein the timing diagram is also applicable to the BJT pixel circuit 300 of FIG. 4. It is assumed that voltage signals of three pixel circuits P1 to P3 are outputted in every frame period. FIG. 10 is applicable, for example, the operation under weak ambient light.

As mentioned above, the image system 3 includes a system light source 40 and a plurality of BJT pixel circuits 300 arranged in matrix. Each of the BJT pixel circuits 300 includes a photodiode 31, a first shutter switch SWshuton, a second shutter switch SWshutoff, a first storage capacitor Con, a second storage capacitor Coff, three reset switches SWres, a first read switch SWron, a second read switch SWroff, a first source follower SFon and a second source follower SFoff. A BJT transistor 33 is selectively arranged in the image system 3.

The BJT pixel circuit 300 is configured to generate voltage signals corresponding to a light source signal S4. The light source signal S4 includes a light-on level and a light-off level. The light-on level is configured to drive the system light source 40 to emit light, and within the light-off level the system light source 40 does not emit light.

Referring to FIGS. 4 and 10, the first shutter switch SWshuton is configured to control, in a first frame period A, a first exposure time (e.g. T4 to T5) of the photodiode 31 to correspond to the light-on level (i.e. the system light source 40 turned on) according to a first shutter signal S21, and control, in a second frame period B, a third exposure time (e.g. T2' to T3') of the photodiode 31 to correspond to the light-on level according to the first shutter signal S21. The second shutter switch SWshutoff is configured to control, in the first frame period A, a second exposure time (e.g. T1 to T2) of the photodiode 31 to correspond to the light-off level according to a second shutter signal S31, and control, in the second frame period B, a fourth exposure time (e.g. T4' to T5') of the photodiode 31 to correspond to the light-off level according to the second shutter signal S31.

In this embodiment, in the first frame period A, the first exposure time (e.g. T4 to T5) is subsequent to the second exposure time (e.g. T1 to T2), and in the second frame period B the third exposure time (T2' to T3') is prior to the fourth exposure time (e.g. T4' to T5').

More specifically speaking, in the first frame period A, the photodiode 31 is firstly exposed corresponding to the deactivation of the system light source 40, and then exposed corresponding to the activation of the system light source 40. In the second frame period B, the photodiode 31 is firstly exposed corresponding to the activation of the system light source 40, and then exposed corresponding to the deactivation of the system light source 40.

The first storage capacitor Con has a first terminal coupled to the photodiode 31 via the first shutter switch SWshuton (e.g. via the node N) and a second terminal coupled to a ground GRD. In this embodiment, the first storage capacitor Con is configured to hold a first predetermined voltage before the first exposure time (e.g. T4 to T5) and discharge to a first output voltage in the first exposure time, and hold a third predetermined voltage before the third exposure time (e.g. T2' to T3') and discharge to a third output voltage in the third exposure time. It should be mentioned that for illustration purpose the first output voltage in the first frame period A and the third output voltage in the second frame period B are shown to be identical (e.g. equal to OUTon), but the present disclosure is not limited thereto. The first output voltage and the third output voltage are determined according to the light intensity impinging onto the photodiode 31. The first predetermined voltage and the third predetermined voltage are substantially identical (e.g. equal to Vinton).

The second storage capacitor Coff has a first terminal coupled to the photodiode 31 via the second shutter switch SWshutoff (e.g. via the node N) and a second terminal coupled to the ground GRD. The second storage capacitor Coff is configured to hold a second predetermined voltage before the second exposure time (e.g. T1 to T2) and discharge to a second output voltage in the second exposure time, and hold a fourth predetermined voltage before the fourth exposure time (e.g. T4' to T5') and discharge to a fourth output voltage in the fourth exposure time. Similarly, the second output voltage in the first frame period A and the fourth output voltage in the second frame period B are shown to be identical (e.g. equal to OUToff), but the present disclosure is not limited thereto. The second output voltage and the fourth output voltage are determined according to the light intensity impinging onto the photodiode 31. The second predetermined voltage and the fourth predetermined voltage are substantially identical (e.g. equal to Vintoff).

In this embodiment, the second frame period B is a next frame period of the first frame period A. The light source signal S4 maintains the light-on level from the first exposure time (e.g. T4 to T5) to the third exposure time (e.g. T2' to T3'), i.e. the system light source 40 is continuously turned on from the first exposure time to the third exposure time without being turned off. In the first frame period A, the light-on level of the light source signal S4 turns on the system light source 40 prior to the first exposure time to form a pre-flash time (e.g. T3 to T4). The light-on level changes to the light-off level when the third exposure time (e.g. T2' to T3') is over.

For example, under weak ambient light the pre-flash time is generally larger than 100 microsecond, which is determined according to different applications. In the present disclosure, a time interval from the first exposure time to the third exposure time (e.g. T5 to T2') is about 5 microsecond, which is much smaller than the pre-flash time, such that the total power consumption is effectively reduced. In addition, as the second frame period B does not include a pre-flash time, a time interval for capturing two successive image frames is reduced so as to increase an average sampling speed thereby increasing the detection speed. It should be mentioned that the ratio relationship between every time interval shown in FIG. 10 is only intended to illustrate but not to limit the present disclosure.

Referring to FIG. 6 again, the image sensor 30 further includes an integrator 37. As the difference between FIG. 9 and FIG. 10 is at a sequence between the first exposure time and the second exposure time instead of at the circuit structure, the operation of the integrator 37 corresponding to every frame period is not changed. That is, in the first frame period A the integrator 37 is configured to perform a differential operation on the first output voltage OUTon and the second output voltage OUToff outputted by each of the BJT pixel circuits 300 to generate differential signals TAP and TAN corresponding to each of the BJT pixel circuits 300, and in the second frame period B perform a differential operation on the third output voltage OUTon and the fourth output voltage OUToff outputted by each of the BJT pixel circuits 300 to generate differential signals TAP and TAN corresponding to each of the BJT pixel circuits 300. The integrator 37 is further configured to accumulate the differential signals TAP and TAN corresponding to a plurality of BJT pixel circuits 300 respectively in the first frame period A and in the second frame period B to generate accumulated different signals. The method of the integrator 37 for performing the differential, amplifying and accumulating operations on the output voltages from each of the BJT pixel circuit 300 has been described above, and thus details thereof are not repeated herein. Finally, an ADC converter 30 converts the amplified and accumulated differential signals to a digital signal Sd to be provided to a processor 39 for post-processing.

As mentioned above, in a reset phase, two reset switches SWres are configured to couple the first storage capacitor Con and the second storage capacitor Coff to a power source $V_{DD}$ according to a reset signal S1 so as to charge the first storage capacitor Con to the first predetermined voltage or the third predetermined voltage (e.g. Vinton), and charge the second storage capacitor Coff to the second predetermined voltage or the fourth predetermined voltage (e.g. Vintoff). In the reset phase, a reset switch SWres is configured to couple the photodiode 31 to a voltage source $V_{DD}$ according to a reset signal S1 to reset the photodiode 31.

As mentioned above, the first read switch SWron is configured to couple the first storage capacitor Con to a readout line Rd1 according to a read signal Sr to output the first output voltage or the third output voltage (e.g. OUTon). The first source follower SFon is configured to buffer the first output voltage and the third output voltage (e.g. OUTon) on the first storage capacitor Con nondestructively to the readout line Rd1.

As mentioned above, the second read switch SWroff is configured to couple the second storage capacitor Coff to a readout line Rd2 according to a read signal Sr to output the second output voltage or the fourth output voltage (e.g. OUToff). The second source follower SFoff is configured to buffer the second output voltage and the fourth output voltage (e.g. OUToff) on the second storage capacitor Coff nondestructively to the readout line Rd2.

In addition, in the present disclosure the image system 30 further includes a controller (e.g. included in the processor 39 and implemented by software and/or hardware) configured to change a sequence of the first exposure time and the second exposure time in the first frame period A according to ambient light intensity. For example, when the controller identifies that the output voltage corresponding to the second exposure time and/or the fourth exposure time is larger than a brightness threshold, or that the differential signals TAP and/or TAN are smaller than a differential threshold, it means that the ambient light La is weak and the timing controller 35 is controlled to generate the control signals of FIG. 10; on the contrary, when the controller identifies that the output voltage corresponding to the second exposure time and/or the fourth exposure time is smaller than the brightness threshold, or that the differential signals TAP and/or TAN are larger than the differential threshold, it means that the ambient light La is strong and the timing controller 35 is controlled to generate the control signals of FIG. 9. It is appreciated that when the sequence is changed, the light source signal S4 is also changed. Accordingly, it is able to achieve the effects of improving the SNR under strong ambient light and reducing the power consumption and increasing the detection speed under weak ambient light. It should be mentioned that the method of identifying ambient light intensity is not limited to those given in the present disclosure and other conventional methods are also possible. The present disclosure is able to change the exposure sequence according to ambient light intensity.

Referring FIG. 10, in the first frame period A, as the second storage capacitor Coff firstly stores the second output voltage and then the first storage capacitor Con stores the first output voltage, the second storage capacitor Coff has higher charge leakage. In the second frame period B, as the first storage capacitor Con firstly stores the third output voltage and then the second storage capacitor Coff stores the fourth output voltage, the first storage capacitor Con has higher charge leakage. By applying the control timing of FIG. 10 to the BJT pixel circuit 300 of FIG. 4, it is able to balance this charge leakage so as to improve the detection accuracy.

Referring FIG. 10, in the first frame period A, the layout coupling effect of the second shutter signal S31 can influence the first predetermined voltage Vinton in the first storage capacitor Con. In the second frame period B, the layout coupling effect of the first shutter signal S21 can influence the fourth predetermined voltage Vintoff in the second storage capacitor Coff. By applying the control timing of FIG. 10 to the BJT pixel circuit 300 of FIG. 4, it is able to balance this layout coupling effect so as to improve the detection accuracy.

Figure 11:
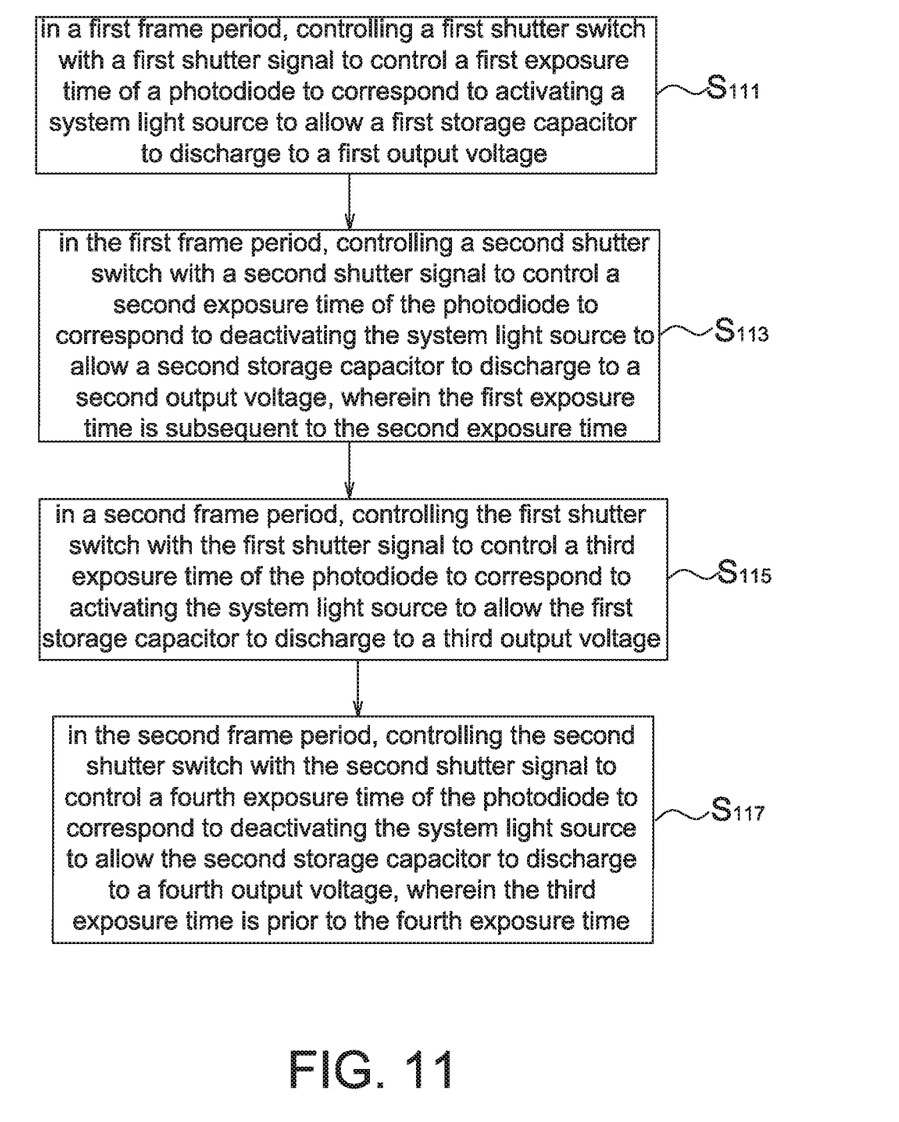
FIG. 11 is a flow chart of an operating method of an image system according to another embodiment of the present disclosure.

Referring to FIG. 11, it is a flow chart of an operating method of an image system according to another embodiment of the present disclosure, which corresponds to the operational timing diagram of FIG. 10. The method includes the steps of: controlling, in a first frame period A, a first shutter switch SWshuton with a first shutter signal S21 so as to control a first exposure time T4 to T5 of a photodiode 31 to correspond to activating a system light source 40 to allow a first storage capacitor Con to discharge to a first output voltage (Step S111); controlling, in the first frame period A, a second shutter switch SWshutoff with a second shutter signal S31 so as to control a second exposure time T1 to T2 of the photodiode 31 to correspond to deactivating the system light source 40 to allow a second storage capacitor Coff to discharge to a second output voltage (Step S113), wherein the first exposure time T4 to T5 is subsequent to the second exposure time T1 to T2; controlling, in a second frame period B, the first shutter switch SWshuton with the first shutter signal S21 so as to control a third exposure time T2' to T3' of the photodiode 31 to correspond to activating the system light source 40 to allow the first storage capacitor Con to discharge to a third output voltage (Step S115); and controlling, in the second frame period B, the second shutter switch SWshutoff with the second shutter signal S31 so as to control a fourth exposure time T4' to T5' of the photodiode 31 to correspond to deactivating the system light source 40 to allow the second storage capacitor Coff to discharge to a fourth output voltage (Step S117), wherein the third exposure time T2' to T3' is prior to the fourth exposure time T4' to T5'. In this embodiment, the second frame period B is a next frame period of the first frame period A. The system light source 40 is continuously turned on from the first exposure time T4 to T5 to the third exposure time T2' to T3' without being turned off. Details of this embodiment are illustrated above and thus are not repeated herein.

In order to be applicable to the environment of both strong light and weak light, the operating method further includes the steps of: detecting ambient light intensity to accordingly change a sequence of the first exposure T4 to T5 and the second exposure time T1 to T2 in the first frame period A. The timing of the second frame period B is not changed.

As mentioned above, the conventional BJT pixel circuit has a pre-flash time in each frame period that can increase the power consumption. Therefore, the present disclosure further provides a pixel circuit with low power consumption (FIG. 4), an image system including the same (FIGS. 6-7) and an operating method thereof (FIGS. 10-11) that changes a sequence of the bright exposure and dark exposure according to ambient light intensity to achieve the effects of improving the signal SNR under strong ambient light and reducing the power consumption under weak ambient light.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An operating method of an image system, the image system comprising a light source and a sensor array, the operating method comprising:
   turning on the light source from a light-on time within a first frame period to a light-off time within a second frame period, wherein the second frame period is a frame period subsequent to the first frame period;
   performing a first dark exposure of the sensor array within the first frame period and before the light-on time;
   performing a first bright exposure of the sensor array within the first frame period and before the second frame period;
   reading, prior to the second frame period, the sensory array according to a read signal;
   performing a second bright exposure of the sensor array within the second frame period and before the light-off time; and
   performing a second dark exposure of the sensor array within the second frame period and after the light-off time,
   wherein the light source is maintained turning on from the light-on time to the light-off time.

2. The operating method as claimed in claim 1, further comprising:
   storing a second output voltage according to the first dark exposure;
   storing a first output voltage according to the first bright exposure;
   reading, prior to the second frame period, the first output voltage and the second output voltage from the sensor array according to the read signal;
   storing a third output voltage according to the second bright exposure; and
   storing a fourth output voltage according to the second dark exposure.

3. The operating method as claimed in claim 1, wherein within the first frame period the light-on time is prior to the first bright exposure to form a pre-flash time.

4. The operating method as claimed in claim 1, wherein the sensor array comprises a first storage capacitor for sequentially storing the first output voltage and the third output voltage, and a second storage capacitor for sequentially storing the second output voltage and the fourth output voltage, the operating method further comprising:
   charging, by a power source, the first storage capacitor to a first predetermined voltage prior to the first bright exposure;
   charging, by the power source, the first storage capacitor to a third predetermined voltage prior to the second bright exposure;
   charging, by the power source, the second storage capacitor to a second predetermined voltage prior to the first dark exposure; and
   charging, by the power source, the second storage capacitor to a fourth predetermined voltage prior to the second dark exposure.

5. The operating method as claimed in claim 4, wherein the sensor array further comprises a first read switch, and the operating method further comprises:
   outputting the first output voltage and the third output signal from the first storage capacitor to a readout line via the first read switch according to the read signal.

6. The operating method as claimed in claim 5, wherein the sensor array further comprises a first source follower for buffering the first output voltage and the third output signal from the first storage capacitor to the readout line.

7. The operating method as claimed in claim 4, wherein the sensor array further comprises a second read switch, and the operating method further comprises:
outputting the second output voltage and the fourth output signal from the second storage capacitor to a readout line via the second read switch according to the read signal.

8. The operating method as claimed in claim 7, wherein the sensor array further comprises a second source follower for buffering the second output voltage and the fourth output signal from the second storage capacitor to the readout line.

9. The operating method as claimed in claim 1, wherein the sensor array comprises a plurality of photodiodes, and the operating method further comprises:
resetting the photodiodes in a reset phase.

10. The operating method as claimed in claim 1, further comprising:
changing a sequence of the first dark exposure and the first bright exposure as well as lighting of the light source according to ambient light intensity.

11. An operating method of an image system, the image system comprising a light source and a sensor array, the operating method comprising:
keeping the light source being continuously turned on from a first frame period to a second frame period, wherein the second frame period is a frame period subsequent to the first frame period;
within the first frame period, performing a bright exposure of the sensor array subsequent to a dark exposure of the sensor array;
reading, prior to the second frame period, the sensory array according to a read signal; and
within the second frame period, performing a bright exposure of the sensor array prior to a dark exposure of the sensor array,
wherein in the bright exposure the light source is being turned on, and in the dark exposure the light source is being turned off.

12. The operating method as claimed in claim 11, further comprising:
storing a second output voltage according to the dark exposure within the first frame period;
storing a first output voltage according to the bright exposure within the first frame period;
reading, prior to the second frame period, the first output voltage and the second output voltage from the sensor array according to the read signal;
storing a third output voltage according to the bright exposure within the second frame period; and
storing a fourth output voltage according to the dark exposure within the second frame period.

13. The operating method as claimed in claim 11, wherein within the first frame period the light source is light-on prior to the bright exposure to form a pre-flash time.

14. The operating method as claimed in claim 11, wherein the sensor array comprises a first storage capacitor for sequentially storing the first output voltage and the third output voltage, and a second storage capacitor for sequentially storing the second output voltage and the fourth output voltage, the operating method further comprising:
charging, by a power source, the first storage capacitor to a first predetermined voltage prior to the bright exposure within the first frame period;
charging, by the power source, the first storage capacitor to a third predetermined voltage prior to the bright exposure within the second frame period;
charging, by the power source, the second storage capacitor to a second predetermined voltage prior to the dark exposure within the first frame period; and
charging, by the power source, the second storage capacitor to a fourth predetermined voltage prior to the dark exposure within the second frame period.

15. The operating method as claimed in claim 14, wherein the sensor array further comprises a first read switch, and the operating method further comprises:
outputting the first output voltage and the third output signal from the first storage capacitor to a readout line via the first read switch according to the read signal.

16. The operating method as claimed in claim 15, wherein the sensor array further comprises a first source follower for buffering the first output voltage and the third output signal from the first storage capacitor to the readout line.

17. The operating method as claimed in claim 14, wherein the sensor array further comprises a second read switch, and the operating method further comprises:
outputting the second output voltage and the fourth output signal from the second storage capacitor to a readout line via the second read switch according to the read signal.

18. The operating method as claimed in claim 17, wherein the sensor array further comprises a second source follower for buffering the second output voltage and the fourth output signal from the second storage capacitor to the readout line.

19. The operating method as claimed in claim 11, wherein the sensor array comprises a plurality of photodiodes, and the operating method further comprises:
resetting the photodiodes in a reset phase.

20. The operating method as claimed in claim 11, further comprising:
changing a sequence of the dark exposure and the bright exposure within the first frame period as well as lighting of the light source according to ambient light intensity.

* * * * *